US011450387B2

(12) United States Patent
Yang

(10) Patent No.: US 11,450,387 B2
(45) Date of Patent: Sep. 20, 2022

(54) METHOD OF CONTROLLING INTERNAL ADDRESS FOR A SERIAL NOR FLASH MEMORY

(71) Applicant: Shanghai Huahong Grace Semiconductor Manufacturing Corporation, Shanghai (CN)

(72) Inventor: Guangjun Yang, Shanghai (CN)

(73) Assignee: Shanghai Huahong Grace Semiconductor Manufacturing Corporation, Shanghai (CN)

(*) Notice: Subject to any disclaimer, the term of this patent is extended or adjusted under 35 U.S.C. 154(b) by 0 days.

(21) Appl. No.: 17/211,060

(22) Filed: Mar. 24, 2021

(65) Prior Publication Data
US 2021/0407580 A1 Dec. 30, 2021

(30) Foreign Application Priority Data
Jun. 28, 2020 (CN) .......................... 202010594516.9

(51) Int. Cl.
G11C 7/10 (2006.01)
G11C 16/26 (2006.01)
G11C 16/02 (2006.01)
G11C 11/408 (2006.01)
G11C 11/4094 (2006.01)
G11C 11/4096 (2006.01)
G11C 5/06 (2006.01)
G11C 16/08 (2006.01)

(52) U.S. Cl.
CPC .............. G11C 16/26 (2013.01); G11C 16/02 (2013.01); G11C 5/066 (2013.01); G11C 7/10 (2013.01); G11C 11/4085 (2013.01); G11C 11/4087 (2013.01); G11C 11/4094 (2013.01); G11C 11/4096 (2013.01); G11C 16/08 (2013.01)

(58) Field of Classification Search
CPC ......... G11C 16/08; G11C 16/32; G11C 16/30; G11C 16/26; G11C 16/02
See application file for complete search history.

(56) References Cited

U.S. PATENT DOCUMENTS 8,102,710 B2 * 1/2012 Pekny .................. G11C 7/1021
365/240
2005/0213421 A1 * 9/2005 Polizzi ..................... G11C 8/04
365/232
2008/0304321 A1 * 12/2008 Kye ....................... G11C 16/28
365/185.13

(Continued)

Primary Examiner — Mushfique Siddique
(74) Attorney, Agent, or Firm — Murtha Cullina LLP

(57) ABSTRACT

The present application discloses a serial flash memory, including a memory array, a row decoder, a column decoder, a control module, and an SPI interface, wherein the control module includes a row enable signal; and when the last bit of an SPI row address in an SPI address signal is to be read, the control module enables the row enable signal, and the row enable signal enables an internal row address of an internal address of the serial flash memory to be valid and enables the row decoder to perform decoding and select the internal row address. The present application further provides an address control method of a serial flash memory. In the present application, the timing requirement on the row address can be relaxed, the area of the row decoder can be reduced, and the area of the row drive circuit can be reduced.

5 Claims, 3 Drawing Sheets

(56) References Cited

U.S. PATENT DOCUMENTS

| | | | |
|---|---|---|---|
| 2015/0318049 A1* | 11/2015 | Behl | G06F 9/4401 711/103 |
| 2016/0034352 A1* | 2/2016 | Michael | G06F 11/1072 714/773 |
| 2018/0151232 A1* | 5/2018 | Chang | G11C 16/32 |
| 2021/0280222 A1* | 9/2021 | Chang | G06F 9/3806 |

* cited by examiner

METHOD OF CONTROLLING INTERNAL ADDRESS FOR A SERIAL NOR FLASH MEMORY

CROSS-REFERENCES TO RELATED APPLICATION

This application claims the priority to Chinese patent application No. CN 202010594516.9 filed at CNIPA on Jun. 28, 2020, and entitled "SERIAL FLASH MEMORY AND ADDRESS CONTROL METHOD THEREOF", the disclosure of which is incorporated herein by reference in entirety.

TECHNICAL FIELD

The present application relates to the field of semiconductor integrated circuit manufacturing, in particular to a serial flash memory. The present application further relates to an address control method of a serial flash memory.

BACKGROUND

FIG. 1 is a structural diagram of a memory cell of an existing serial flash memory; FIG. 2 is a diagram of a memory array of the existing serial flash memory; FIG. 3, is a schematic structural diagram of the existing serial flash memory; and FIG. 4 is a timing diagram of address transmission during a read operation on the existing serial flash memory. The existing serial flash memory 201 includes: a memory array 102, a row decoder 204, a column decoder 205, a control module 203, and a serial peripheral interface (SPI), i.e., an SPI interface 202.

Generally, an arrangement structure of the memory cells 101 of the memory array 102 is a NOR type.

Each of the memory cells 101 includes a gate structure, a source region 6, a drain region 7, and a channel region. The channel region is located between the source region 6 and the drain region 7 and is covered by the gate structure.

The gate structure includes a stack structure which is composed of a first gate dielectric layer 2, a floating gate 3, a second gate dielectric layer 4, and a polysilicon control gate 5 and formed on the surface of a semiconductor substrate 1. Generally, a sidewall 8 is formed at the side of the gate structure. The floating gate 3 is usually a polysilicon floating gate used for storing information. When there are electrons stored in the polysilicon floating gate, a threshold voltage of the memory cell 101 is increased, and the memory cell 101 is disabled during reading, such that a corresponding bit line is at a high level, in which case the stored information is 1, and the information 1 can be achieved by means of programming electron injection. When there is no electron stored in the polysilicon floating gate, the threshold voltage of the memory cell 101 is decreased, and the memory cell 101 is enabled during reading, such that the corresponding bit line is at a low level, in which case the stored information is 0, and the information 0 is a corresponding post-erasing state. The first gate dielectric layer 2 is usually an oxide layer. The second gate dielectric layer 4 is an oxide layer or a stack layer composed of an oxide layer, a nitride layer, and an oxide layer, i.e., an ONO layer. The semiconductor substrate 1 is usually a silicon substrate. The material of the sidewall 8 is an oxide layer or a nitride layer.

The polysilicon control gates 5 of the memory cells 101 in the same row are all connected to a word line (WL) of the same row, and the drain regions 7 of the memory cells 101 in the same column are all connected to a bit line (BL) of the same column. The source region 6 of each memory cell 101 is connected to a source line (SL). FIG. 2 shows j word lines respectively represented by WL1, WL2, ..., and WLj and shows i bit lines respectively represented by BL1, BL2, ..., and BLi.

The memory array 102 is divided into a plurality of sectors, and an address of the memory cell 101 is determined by a sector address, a row address, and a column address.

The serial flash memory 201 further includes a row drive circuit 207, and the row drive circuit 207 drives a row signal during a row decoding process.

The control module 203 includes a read enable signal REN. During a read process, when a word-length address of an SPI address signal is to be read, the control module 203 enables the read enable signal REN, such that the internal address is valid and reading starts. When the internal address is valid, the internal address is separately transmitted to the row decoder 204 for row decoding and to the column decoder 205 for column decoding via the control module 203. Generally, the word length includes 16 bits (×16), 32 bits (×16), 64 bits (×16), or 128 bits (×128). In FIG. 4, a bit corresponding to the word-length address of the SPI address signal is $A_n$. It can be seen that when transmission is to be performed at $A_n$, the level of the read enable signal REN rises to a high level, and at a rising edge of the read enable signal REN, the invalid internal address becomes valid. In FIG. 4, the invalid internal address is represented by a cross, and the valid internal address is represented by Valid.

Referring to in FIG. 3, the serial flash memory 201 further includes a readout circuit 206, and the readout circuit 206 includes a sense amplifier (SA) used for amplifying a signal read from the bit line. Finally, read data is transmitted to the control module 203, and then the control module 203 transmits the data to the SPI interface 202.

After an code or address input by the SPI interface 202 is transmitted to the control module 203, the control module 203 controls a corresponding operation according to the code and transmits the address to the row decoder 204 and the column decoder 205 to implement row address decoding and column address decoding respectively, and finally, an operation such as erasing, writing, or reading on a memory cell corresponding to the decoded address is implemented. The control module 203 also controls the row drive circuit 207.

Generally, the SPI address signal includes an SPI transmission sector address, an SPI row address, and an SPI column address. In the SPI address signal, the most significant bit (MSB) of the SPI address signal is the most significant bit of the SPI sector address, the least significant bit (LSB) of the SPI address signal is the least significant bit of the SPI column address, and the SPI row address is between the SPI sector address and the SPI column address.

The SPI address signal is input bit by bit from the most significant bit to the least significant bit during an input process, that is, transmission is performed from MSB to LSB in FIG. 4, wherein MSB corresponds to $A_m$, and a bit corresponding to LSB is $A_0$ (not shown). In FIG. 4, a bit following behind $A_m$ is $A_{m-1}$, the subscript values of following bits are decreased by one successively, and each bit is represented by two dots, until it reaches $A_n$ and $A_{n-1}$, or until it reaches $A_0$.

The SPI interface 202 includes a selection signal pin CE, a clock signal pin SCLK, an input signal pin SI, and an output signal pin SO. The SPI address signal is input into the serial flash memory 201 via the input signal pin SI.

Generally, the SPI interface 202 is connected to an SPI interface controller, and the SPI interface controller is connected to a processor. A connection wire between the SPI interface 202 and the SPI interface controller is an SPI wire; and the SPI interface controller and the processor are connected to each other via parallel connection wires. The processor selects the corresponding serial flash memory 201 via the selection signal pin CE, then inputs a clock signal to the clock signal pin SCLK of the serial flash memory 201, and then inputs corresponding code, address, or data to the input signal pin SI of the serial flash memory 201. If there is data in the serial flash memory 201 to be output, the data is output via the output signal pin SO. Connection wires of the serial flash memory 201 and power consumption can be reduced by means of the SPI interface 202.

It can be seen from FIG. 4 that, in the prior art, the internal address is valid only when a word-length address of the SPI address signal is read. If the internal address is valid, row decoding and column decoding are performed at the same time, only then can operations such as reading be performed on the memory cell 101 corresponding to the address. In this case, requirements on row decoding and driving are relatively high, and a relatively large area is occupied.

BRIEF SUMMARY

The technical problem to be solved by the present application is to provide a serial flash memory, to relax the timing requirement on a row address, reduce the area of a row decoder, and reduce the area of a row drive circuit. To this end, the present application further provides an address control method of a serial flash memory.

In order to solve the above technical problem, the serial flash memory provided in the present application comprises: a memory array, a row decoder, a column decoder, a control module, and an SPI interface.

The control module comprises a row enable signal.

When the last bit of an SPI row address in an SPI address signal is to be read, the control module enables the row enable signal, and the row enable signal enables an internal row address of an internal address of the serial flash memory to be valid and enables the row decoder to perform decoding and select the internal row address.

In an improvement, the serial flash memory further comprises a row drive circuit, and when the row enable signal is enabled, the row drive circuit operates.

In an improvement, the control module further comprises a read enable signal.

During a read process, when a word-length address of the SPI address signal is to be read, the control module enables the read enable signal, such that the internal address is valid and reading starts, the time for selecting the internal row address is before the moment at which the reading starts, and when the internal address is valid, the column decoder starts to decode an internal column address of the internal address.

In an improvement, the word length comprises 16 bits, 32 bits, 64 bits, or 128 bits.

In an improvement, an arrangement structure of memory cells of the memory array is a NOR type.

Each of the memory cells comprises a gate structure, a source region, a drain region, and a channel region.

The gate structure comprises a stack structure which is composed of a first gate dielectric layer, a floating gate, a second gate dielectric layer, and a polysilicon control gate and formed on the surface of a semiconductor substrate.

The polysilicon control gates of the memory cells in the same row are all connected to a word line of the same row, and the drain regions of the memory cells in the same column are all connected to a bit line of the same column.

In an improvement, the memory array is divided into a plurality of sectors, and an address of the memory cell is determined by a sector address, a row address, and a column address.

The SPI address signal comprises an SPI transmission sector address, an SPI row address, and an SPI column address, in the SPI address signal, the most significant bit of the SPI address signal is the most significant bit of the SPI sector address, the least significant bit of the SPI address signal is the least significant bit of the SPI column address, and the SPI row address is between the SPI sector address and the SPI column address.

The SPI address signal is input bit by bit from the most significant bit to the least significant bit during an input process.

The last bit of the SPI row address is the least significant bit of the SPI row address.

The SPI interface comprises a selection signal pin, a clock signal pin, an input signal pin, and an output signal pin, and the SPI address signal is input into the serial flash memory via the input signal pin.

In order to solve the above technical problem, in the address control method of a serial flash memory provided in the present application, the serial flash memory comprises: a memory array, a row decoder, a column decoder, a control module, and an SPI interface, wherein operation steps of the serial flash memory comprise the following address control steps.

The control module inputs an SPI address signal via the SPI interface, and when the last bit of an SPI row address in the SPI address signal is to be read, the control module enables a row enable signal.

The row enable signal enables an internal row address of an internal address of the serial flash memory to be valid and enables the row decoder to perform decoding and select the internal row address.

In an improvement, the serial flash memory further comprises a row drive circuit, and when the row enable signal is enabled, the row drive circuit operates.

In an improvement, when the operation step is a read step, during a read process, when a word-length address of the SPI address signal is to be read, the control module enables a read enable signal, such that the internal address is valid and reading starts, the time for selecting the internal row address is before the moment at which the reading starts, and when the internal address is valid, the column decoder starts to decode an internal column address of the internal address.

In an improvement, the word length comprises 16 bits, 32 bits, 64 bits, or 128 bits.

In an improvement, an arrangement structure of memory cells of the memory array is a NOR type.

Each of the memory cells comprises a gate structure, a source region, a drain region, and a channel region.

The gate structure comprises a stack structure which is composed of a first gate dielectric layer, a floating gate, a second gate dielectric layer, and a polysilicon control gate and formed on the surface of a semiconductor substrate.

The polysilicon control gates of the memory cells in the same row are all connected to a word line of the same row, and the drain regions of the memory cells in the same column are all connected to a bit line of the same column.

In an improvement, the memory array is divided into a plurality of sectors, and an address of the memory cell is determined by a sector address, a row address, and a column address.

The SPI address signal comprises an SPI transmission sector address, an SPI row address, and an SPI column address, in the SPI address signal, the most significant bit of the SPI address signal is the most significant bit of the SPI sector address, the least significant bit of the SPI address signal is the least significant bit of the SPI column address, and the SPI row address is between the SPI sector address and the SPI column address.

In an improvement, the SPI address signal is input bit by bit from the most significant bit to the least significant bit during an input process; and the last bit of the SPI row address is the least significant bit of the SPI row address.

In the present application, the row enable signal is added to the control module, and detection of the last bit of the SPI row address is added during reading of the SPI address signal. When the last bit of the SPI row address in the SPI address signal is to be read, the control module enables the row enable signal, and the row enable signal enables the internal row address of the internal address of the serial flash memory to be valid and enables the row decoder to perform decoding and select the internal row address. Therefore, the present application can overcome the defect in the prior art that the row decoder is enabled together with the column decoder after the SPI address signal of a word length is read. In the present application, enablement of the row decoder can be advanced by at least one cycle, relaxing the timing requirement on the row address, thereby lowering the performance requirement on the row decoder, thus reducing the area of the row decoder.

In addition, since the row address is usually driven by the row drive circuit, the present application can also lower the performance requirement on the row drive circuit, thereby reducing the area of the row drive circuit.

BRIEF DESCRIPTION OF THE DRAWINGS

The present application will be further described in detail below with reference to the drawings and specific implementations.

DETAILED DESCRIPTION OF THE DISCLOSURE

Figure 5:
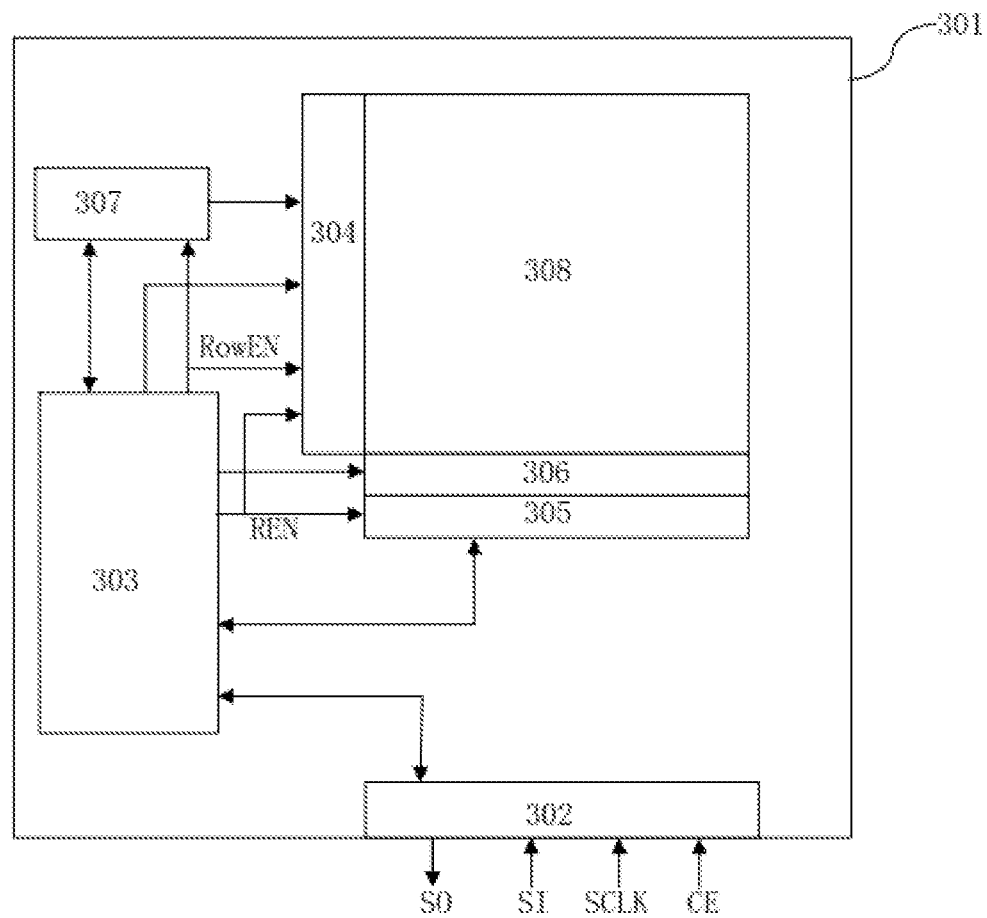
FIG. 5 is a schematic structural diagram of a serial flash memory in an embodiment of the present application.
Figure 6:
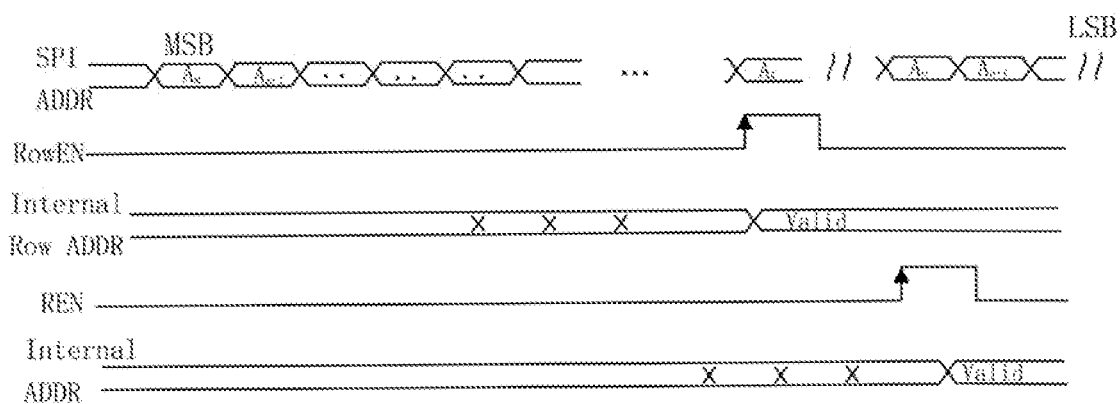
FIG. 6 is a timing diagram of address transmission during a read operation on a serial flash memory in an embodiment of the present application.

FIG. 5 is a schematic structural diagram of a serial flash memory 301 in an embodiment of the present application; and FIG. 6 is a timing diagram of address transmission during a read operation on the serial flash memory 301 in the embodiment of the present application. The serial flash memory 301 in the embodiment of the present application includes: a memory array 308, a row decoder 304, a column decoder 305, a control module 303, and an SPI interface 302.

Figure 1:
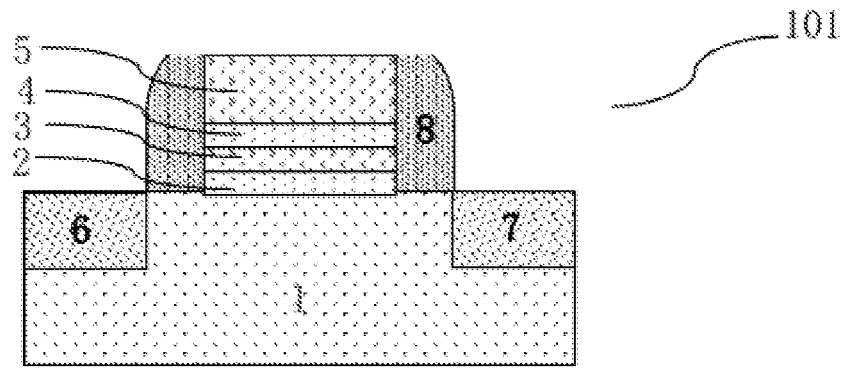
FIG. 1 is a structural diagram of a memory cell of an existing serial flash memory.

In the embodiment of the present application, an arrangement structure of memory cells 101 of the memory array 308 is a NOR type. For the structure of the memory array 308, reference may be made to the existing memory array 102 shown in FIG. 2. For the memory cell 101 of the memory array 308, reference may be made to FIG. 1.

Each of the memory cells 101 includes a gate structure, a source region 6, a drain region 7, and a channel region. The channel region is located between the source region 6 and the drain region 7 and is covered by the gate structure.

The gate structure includes a stack structure which is composed of a first gate dielectric layer 2, a floating gate 3, a second gate dielectric layer 4, and a polysilicon control gate 5 and formed on the surface of a semiconductor substrate 1. Generally, a sidewall 8 is formed at the side of the gate structure. The floating gate 3 is usually a polysilicon floating gate used for storing information. When there are electrons stored in the polysilicon floating gate, a threshold voltage of the memory cell 101 is increased, and the memory cell 101 is disabled during reading, such that a corresponding bit line is at a high level, in which case the stored information is 1, and the information 1 can be achieved by means of programming electron injection. When there is no electron stored in the polysilicon floating gate, the threshold voltage of the memory cell 101 is decreased, and the memory cell 101 is enabled during reading, such that the corresponding bit line is at a low level, in which case the stored information is 0, and the information 0 is a corresponding post-erasing state. The first gate dielectric layer 2 is usually an oxide layer. The second gate dielectric layer 4 is an oxide layer or a stack layer composed of an oxide layer, a nitride layer, and an oxide layer, i.e., an ONO layer. The semiconductor substrate 1 is usually a silicon substrate. The material of the sidewall 8 is an oxide layer or a nitride layer.

Figure 2:
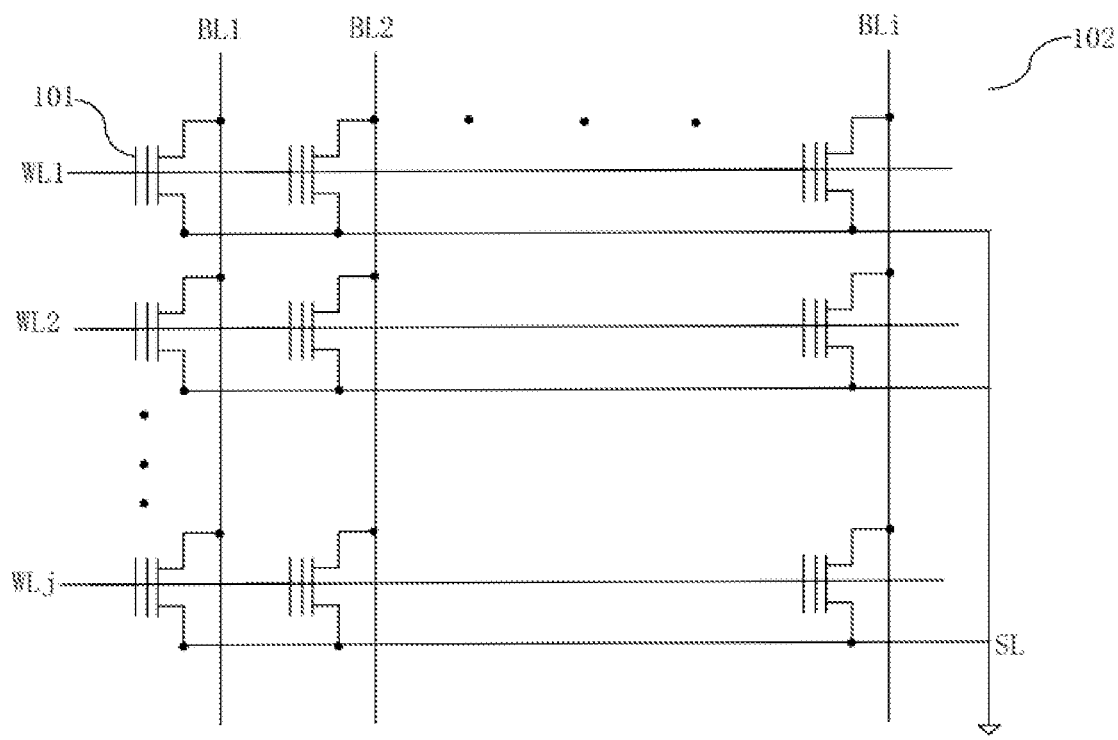
FIG. 2 is a diagram of a memory array of the existing serial flash memory.
Figure 3:
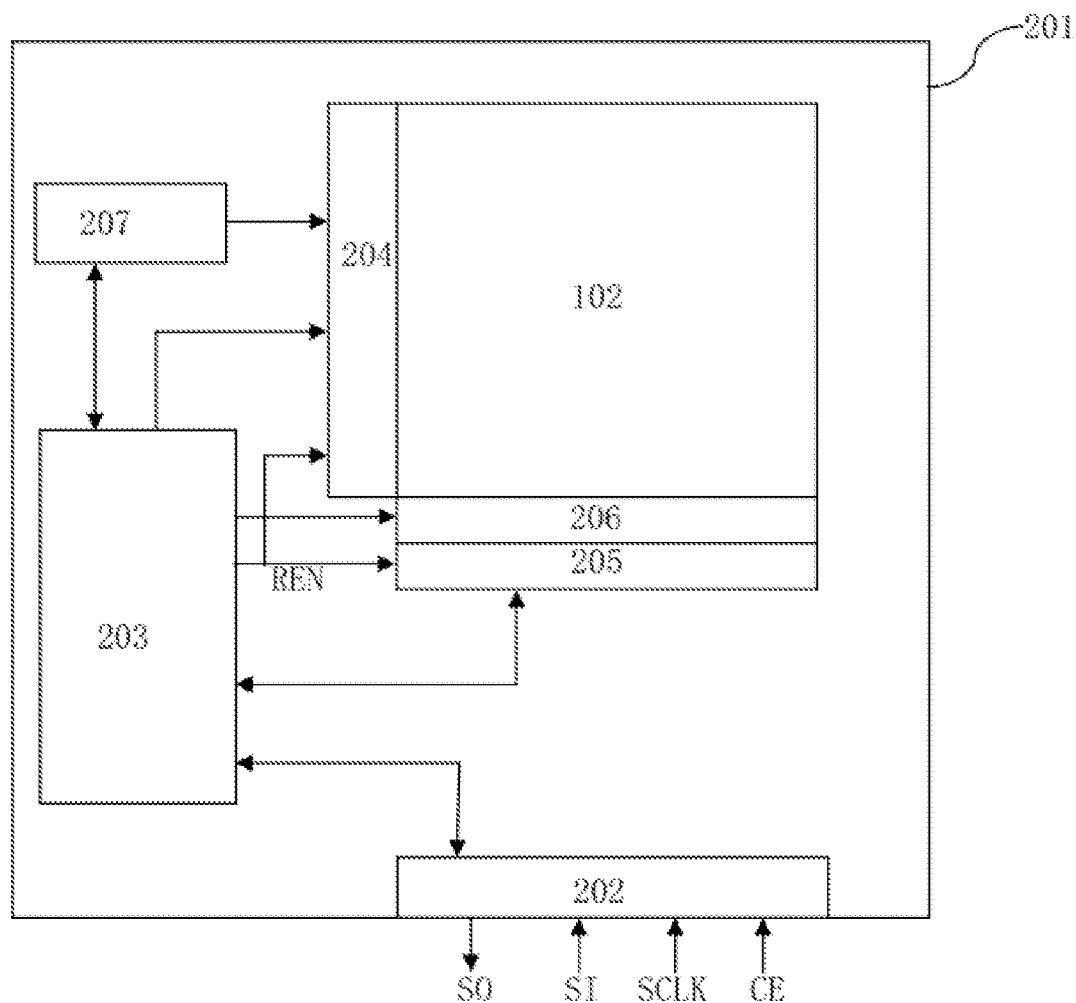
FIG. 3 is a schematic structural diagram of the existing serial flash memory.
Figure 4:
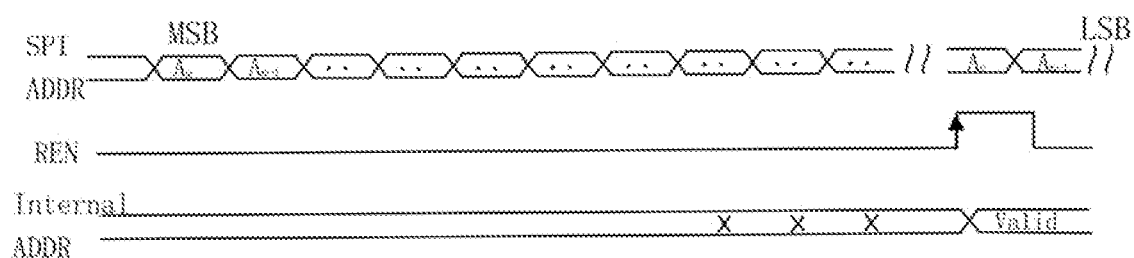
FIG. 4 is a timing diagram of address transmission during a read operation on the existing serial flash memory.

The polysilicon control gates 5 of the memory cells 101 in the same row are all connected to a word line of the same row, and the drain regions 7 of the memory cells 101 in the same column are all connected to a bit line of the same column. The source region 6 of each memory cell 101 is connected to a source line. FIG. 2 shows j word lines respectively represented by WL1, WL2, . . . , and WLj and shows i bit lines respectively represented by BL1, BL2, . . . , and BLi.

The memory array 308 is divided into a plurality of sectors, and an address of the memory cell 101 is determined by a sector address, a row address, and a column address.

The control module 303 includes a row enable signal RowEN.

Referring to in FIG. 6, when the last bit of an SPI row address in an SPI address signal is to be read, the control module 303 enables the row enable signal RowEN, and the row enable signal RowEN enables an internal row address of an internal address of the serial flash memory 301 to be valid and enables the row decoder 304 to perform decoding and select the internal row address. In FIG. 6, the SPI address signal is represented by SPI ADDR, the last bit of the SPI row address is $A_k$, the internal address is represented by Internal ADDR, and the internal row address is represented by Internal Row ADDR. It can be seen that when transmission is to be performed at $A_k$, the level of the row enable signal RowEN rises to a high level, and at a rising edge of the row enable signal RowEN, the invalid internal address becomes valid. In FIG. 6, the invalid internal address is represented by a cross, and the valid internal address is represented by Valid.

Referring to in FIG. 5, the serial flash memory 301 further includes a row drive circuit 307, and when the row enable signal RowEN is enabled, the row drive circuit 307 operates.

The control module 303 further includes a read enable signal REN.

During a read process, when a word-length address of the SPI address signal is to be read, the control module 303 enables the read enable signal REN, such that the internal address is valid and reading starts. The time for selecting the internal row address is before the moment at which the reading starts. When the internal address is valid, the column decoder 305 starts to decode an internal column address of the internal address. In the embodiment of the present application, the word length includes 16 bits, 32 bits, 64 bits, or 128 bits. In FIG. 6, a bit corresponding to the word-length address of the SPI address signal is $A_n$. It can be seen that when transmission is to be performed at $A_n$, the level of the read enable signal REN rises to a high level, and at a rising edge of the read enable signal REN, the invalid internal address becomes valid. In FIG. 6, the invalid internal address is represented by a cross, and the valid internal address is represented by Valid.

Referring to in FIG. 5, the serial flash memory 301 further includes a readout circuit 306, and the readout circuit 306 includes a sense amplifier used for amplifying a signal of a read bit line. Finally, read data is transmitted to the control module 303, and then the control module 303 transmits the data to the SPI interface 302.

After an code or address input by the SPI interface 302 is transmitted to the control module 303, the control module 303 controls a corresponding operation according to the code and transmits the address to the row decoder 304 and the column decoder 305 to implement row address decoding and column address decoding respectively, and finally, an operation such as erasing, writing, or reading on a memory cell corresponding to the decoded address is implemented. The control module 303 also controls the row drive circuit 307.

In the embodiment of the present application, the SPI address signal includes an SPI transmission sector address, an SPI row address, and an SPI column address. In the SPI address signal, the most significant bit of the SPI address signal is the most significant bit of the SPI sector address, the least significant bit of the SPI address signal is the least significant bit of the SPI column address, and the SPI row address is between the SPI sector address and the SPI column address.

The SPI address signal is input bit by bit from the most significant bit to the least significant bit during an input process, that is, transmission is performed from MSB to LSB in FIG. 6, wherein MSB corresponds to $A_m$, and a bit corresponding to LSB is $A_0$ (not shown). In FIG. 6, a bit following behind $A_m$ is $A_{m-1}$, the subscript values of following bits are decreased by one successively, each bit is represented by two dots, until it reaches $A_k$, and bits distant from $A_k$ for more than one bit are $A_n$ and $A_{n-1}$, until it reaches $A_0$.

The last bit of the SPI row address is the least significant bit of the SPI row address, that is, $A_k$ is the least significant bit of the SPI row address.

The SPI interface 302 includes a selection signal pin CE, a clock signal pin SCLK, an input signal pin SI, and an output signal pin SO. The SPI address signal is input into the serial flash memory 301 via the input signal pin SI.

Generally, the SPI interface 302 is connected to an SPI interface controller, and the SPI interface controller is connected to a processor. A connection wire between the SPI interface 302 and the SPI interface controller is an SPI wire; and the SPI interface controller and the processor are connected to each other via parallel connection wires. The processor selects the corresponding serial flash memory 301 via the selection signal pin CE, then inputs a clock signal to the clock signal pin SCLK of the serial flash memory 301, and then inputs corresponding code, address, or data to the input signal pin SI of the serial flash memory 301. If there is data in the serial flash memory 301 to be output, the data is output via the output signal pin SO. Connection wires of the serial flash memory 301 and power consumption can be reduced by means of the SPI interface 302.

In the embodiment of the present application, the row enable signal RowEN is added to the control module 303, and detection of the last bit of the SPI row address is added during reading of the SPI address signal. When the last bit of the SPI row address in the SPI address signal is to be read, the control module 303 enables the row enable signal RowEN, and the row enable signal RowEN enables the internal row address of the internal address of the serial flash memory 301 to be valid and enables the row decoder 304 to perform decoding and select the internal row address. Therefore, the embodiment of the present application can overcome the defect in the prior art that the row decoder 304 is enabled together with the column decoder 305 after the SPI address signal of a word length is read. In the embodiment of the present application, enablement of the row decoder 304 can be advanced by at least one cycle, relaxing the timing requirement on the row address, thereby lowering the performance requirement on the row decoder 304, thus reducing the area of the row decoder 304.

In addition, since the row address is usually driven by the row drive circuit 307, the embodiment of the present application can also lower the performance requirement on the row drive circuit 307, thereby reducing the area of the row drive circuit 307.

In an address control method of a serial flash memory 301 in an embodiment of the present application, the serial flash memory 301 includes: a memory array 308, a row decoder 304, a column decoder 305, a control module 303, and an SPI interface 302.

In the method of the embodiment of the present application, an arrangement structure of memory cells 101 of the memory array 308 is a NOR type. For the structure of the memory array 308, reference may be made to the existing memory array 102 shown in FIG. 2. For the memory cell 101 of the memory array 308, reference may be made to FIG. 1.

Each of the memory cells 101 includes a gate structure, a source region 6, a drain region 7, and a channel region. The channel region is located between the source region 6 and the drain region 7 and is covered by the gate structure.

The gate structure includes a stack structure which is composed of a first gate dielectric layer 2, a floating gate 3, a second gate dielectric layer 4, and a polysilicon control gate 5 and formed on the surface of a semiconductor substrate 1. Generally, a sidewall 8 is formed at the side of the gate structure. The floating gate 3 is usually a polysilicon floating gate used for storing information. When there are electrons stored in the polysilicon floating gate, a threshold voltage of the memory cell 101 is increased, and the memory cell 101 is disabled during reading, such that a corresponding bit line is at a high level, in which case the stored information is 1, and the information 1 can be achieved by means of programming electron injection. When there is no electron stored in the polysilicon floating gate, the threshold voltage of the memory cell 101 is decreased, and the memory cell 101 is enabled during reading, such that the corresponding bit line is at a low level, in which case the stored information is 0, and the information 0 is a corresponding post-erasing state. The first gate dielectric layer 2 is usually an oxide layer. The second gate dielectric layer 4 is an oxide layer or a stack layer composed of an oxide layer, a nitride layer, and an oxide layer, i.e., an ONO layer. The semiconductor substrate 1 is usually a silicon substrate. The material of the sidewall 8 is an oxide layer or a nitride layer.

The polysilicon control gates 5 of the memory cells 101 in the same row are all connected to a word line of the same row, and the drain regions 7 of the memory cells 101 in the same column are all connected to a bit line of the same column. The source region 6 of each memory cell 101 is connected to a source line. FIG. 2 shows j word lines respectively represented by WL1, WL2, . . . , and WLj and shows i bit lines respectively represented by BL1, BL2, . . . , and BLi.

The memory array 308 is divided into a plurality of sectors, and an address of the memory cell 101 is determined by a sector address, a row address, and a column address.

The control module 303 includes a row enable signal RowEN.

Operation steps of the serial flash memory 301 include the following address control steps.

The control module 303 inputs an SPI address signal via the SPI interface 302, and when the last bit of an SPI row address in the SPI address signal is to be read, the control module 303 enables the row enable signal RowEN.

The row enable signal RowEN enables an internal row address of an internal address of the serial flash memory 301 to be valid and enables the row decoder 304 to perform decoding and select the internal row address.

In FIG. 6, the SPI address signal is represented by SPI ADDR, the last bit of the SPI row address is $A_k$, the internal address is represented by Internal ADDR, and the internal row address is represented by Internal Row ADDR. It can be seen that when transmission is to be performed at $A_k$, the level of the row enable signal RowEN rises to a high level, and at a rising edge of the row enable signal RowEN, the invalid internal address becomes valid. In FIG. 6, the invalid internal address is represented by a cross, and the valid internal address is represented by Valid.

Referring to in FIG. 5, the serial flash memory 301 further includes a row drive circuit 307, and when the row enable signal RowEN is enabled, the row drive circuit 307 operates.

In the method of the embodiment of the present application, when the operation step is a read step, during a read process, when a word-length address of the SPI address signal is to be read, the control module 303 enables a read enable signal REN, such that the internal address is valid and reading starts. The time for selecting the internal row address is before the moment at which the reading starts. When the internal address is valid, the column decoder 305 starts to decode an internal column address of the internal address. In the embodiment of the present application, the word length includes 16 bits, 32 bits, 64 bits, or 128 bits. In FIG. 6, a bit corresponding to the word-length address of the SPI address signal is $A_n$. It can be seen that when transmission is to be performed at $A_n$, the level of the read enable signal REN rises to a high level, and at a rising edge of the read enable signal REN, the invalid internal address becomes valid. In FIG. 6, the invalid internal address is represented by a cross, and the valid internal address is represented by Valid.

In the embodiment of the present application, the SPI address signal includes an SPI transmission sector address, an SPI row address, and an SPI column address. In the SPI address signal, the most significant bit of the SPI address signal is the most significant bit of the SPI sector address, the least significant bit of the SPI address signal is the least significant bit of the SPI column address, and the SPI row address is between the SPI sector address and the SPI column address.

The SPI address signal is input bit by bit from the most significant bit to the least significant bit during an input process, that is, transmission is performed from MSB to LSB in FIG. 6, wherein MSB corresponds to $A_m$, and a bit corresponding to LSB is $A_0$ (not shown). In FIG. 6, a bit following behind $A_m$ is $A_{m-1}$, the subscript values of following bits are decreased by one successively, each bit is represented by two dots, until it reaches $A_k$, and bits distant from $A_k$ for more than one bit are $A_n$ and $A_{n-1}$, until it reaches $A_0$.

The last bit of the SPI row address is the least significant bit of the SPI row address, that is, $A_k$ is the least significant bit of the SPI row address.

The SPI interface 302 includes a selection signal pin CE, a clock signal pin SCLK, an input signal pin SI, and an output signal pin SO. The SPI address signal is input into the serial flash memory 301 via the input signal pin SI.

The present application is described in detail above via specific embodiments, but these embodiments are not intended to limit the present application. Without departing from the principle of the present application, those skilled in the art can still make many variations and improvements, which should also be considered to fall into the protection scope of the present application.

What is claimed is:

1. A method of controlling internal address for a serial NOR flash memory, the serial NOR flash memory comprising: a memory array, a row decoder, a column decoder, a control module, and an SPI interface, wherein operation steps of the serial NOR flash memory comprise the following address control steps:
    the control module inputs an SPI address signal via the SPI interface, and when the last bit of an SPI row address in the SPI address signal is to be read, the control module enables a row enable signal; and
    the row enable signal enables an internal row address of an internal address of the serial NOR flash memory to be valid and enables the row decoder to perform decoding and select the internal row address, the row enable signal is a pulse signal,
        wherein the serial NOR flash memory further comprises a row drive circuit, and when the row enable signal is enabled, the row drive circuit operates,
        wherein when the operation step is read step, during a read process, when a word-length address of the SPI address signal is to be read, the control module enables a read enable signal, such that the internal address is valid and reading starts, the time for selecting the internal row address is before the moment at which the reading starts, and when the internal address is valid, the column decoder starts to decode an internal column address of the internal address, the read enable signal is a pulse signal.

2. The method of controlling internal address for a serial NOR flash memory according to claim 1, wherein the word length comprises 16 bits, 32 bits, 64 bits, or 128 bits.

3. The method of controlling internal address for a serial NOR flash memory according to claim 1, wherein an arrangement structure of memory cells of the memory array is a NOR type;
    each of the memory cells comprises a gate structure, a source region, a drain region, and a channel region;
    the gate structure comprises a stack structure which is composed of a first gate dielectric layer, a floating gate, a second gate dielectric layer, and a polysilicon control gate and formed on the surface of a semiconductor substrate; and the polysilicon control gates of the memory cells in the same row are all connected to a word line of the same row, and the drain regions of the memory cells in the same column are all connected to a bit line of the same column.

4. The method of controlling internal address for a serial NOR flash memory according to claim 3, wherein the memory array is divided into a plurality of sectors, and an address of the memory cell is determined by a sector address, a row address, and a column address; and the SPI address signal comprises an SPI transmission sector address, an SPI row address, and an SPI column address, in the SPI address signal, the most significant bit of the SPI address signal is the most significant bit of the SPI sector address, the least significant bit of the SPI address signal is the least significant bit of the SPI column address, and the SPI row address is between the SPI sector address and the SPI column address.

5. The method of controlling internal address for a serial NOR flash memory according to claim 4, wherein the SPI address signal is input bit by bit from the most significant bit to the least significant bit during an input process; and the last bit of the SPI row address is the least significant bit of the SPI row address.

* * * * *